(12) United States Patent
Basin et al.

(10) Patent No.: US 8,771,577 B2
(45) Date of Patent: Jul. 8, 2014

(54) LIGHT EMITTING DEVICE WITH MOLDED WAVELENGTH CONVERTING LAYER

(75) Inventors: Grigoriy Basin, San Francisco, CA (US); Paul S. Martin, Singapore (SG)

(73) Assignees: Koninklijke Philips N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 249 days.

(21) Appl. No.: 12/706,149

(22) Filed: Feb. 16, 2010

(65) Prior Publication Data

US 2011/0198780 A1    Aug. 18, 2011

(51) Int. Cl.
    B29C 43/18    (2006.01)
(52) U.S. Cl.
    USPC ............ 264/266; 264/272.16; 264/261
(58) Field of Classification Search
    None
    See application file for complete search history.

(56) References Cited

U.S. PATENT DOCUMENTS

| | | | | |
|---|---|---|---|---|
| 5,959,316 A | * | 9/1999 | Lowery | 257/98 |
| 6,977,188 B2 | * | 12/2005 | Takase | 438/106 |
| 7,352,011 B2 | * | 4/2008 | Smits et al. | 257/99 |
| 7,452,737 B2 | * | 11/2008 | Basin et al. | 438/27 |
| 7,528,077 B2 | | 5/2009 | Izuno et al. | |
| 7,943,952 B2 | * | 5/2011 | Loh et al. | 257/100 |
| 7,989,236 B2 | * | 8/2011 | Yamaguchi et al. | 438/26 |
| 2002/0141006 A1 | * | 10/2002 | Pocius et al. | 359/15 |
| 2004/0257797 A1 | * | 12/2004 | Suehiro et al. | 362/34 |
| 2005/0151147 A1 | | 7/2005 | Izuno et al. | |
| 2006/0102914 A1 | * | 5/2006 | Smits et al. | 257/98 |
| 2006/0171152 A1 | | 8/2006 | Suehiro et al. | |
| 2007/0164300 A1 | * | 7/2007 | Nabeta et al. | 257/98 |
| 2009/0186433 A1 | * | 7/2009 | Yamaguchi et al. | 438/26 |
| 2010/0155738 A1 | * | 6/2010 | Nabeta et al. | 257/76 |
| 2010/0308354 A1 | * | 12/2010 | David et al. | 257/98 |
| 2011/0031516 A1 | * | 2/2011 | Basin et al. | 257/98 |
| 2012/0168795 A1 | * | 7/2012 | Liu | 257/98 |

FOREIGN PATENT DOCUMENTS

WO    2007049187 A1    5/2007
WO    2008149256 A1    12/2008

* cited by examiner

*Primary Examiner* — Edmund H. Lee

(57) ABSTRACT

A flexible film comprising a wavelength converting material is positioned over a light source. The flexible film is conformed to a predetermined shape. In some embodiments, the light source is a light emitting diode mounted on a support substrate. The diode is aligned with an indentation in a mold such that the flexible film is disposed between the support substrate and the mold. Transparent molding material is disposed between the support substrate and the mold. The support substrate and the mold are pressed together to cause the molding material to fill the indentation. The flexible film conforms to the shape of the light source or the mold.

19 Claims, 3 Drawing Sheets

LIGHT EMITTING DEVICE WITH MOLDED WAVELENGTH CONVERTING LAYER

BACKGROUND

1. Field of Invention

The present invention relates to a wavelength converted light emitting device.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates an LED described in more detail in U.S. Pat. No. 7,352,011, which is incorporated herein by reference. An LED 10 is mounted on a support structure (not shown in FIG. 1). An inner lens 64 is molded over LED 10. Lens 64 is formed as follows: a mold in the shape of lens 64 is positioned over LED 10. The mold may be lined with a non-stick film. The mold is filled with a suitable transparent heat-curable liquid lens material such as silicone or epoxy. A vacuum seal is created between the periphery of the support structure and the mold, and the two pieces are pressed against each other so that each LED die 10 is inserted into the liquid lens material and the lens material is under compression. The mold is then heated to about 150 degrees centigrade (or other suitable temperature) for a time to harden the lens material. The support structure is then separated from the mold. In a separate molding step (using a mold with deeper and wider indentations) an outer phosphor/silicone shell 66 of any thickness is formed directly over the inner lens 64. An outer lens 68 may be formed over the phosphor/silicone shell 66 using another mold to further shape the beam.

SUMMARY

It is an object of the invention to provide a wavelength converting material in a flexible film which is molded over a light source. In some embodiments, the thickness of the wavelength converting material may be tightly controlled.

In embodiments of the invention, a flexible film comprising a wavelength converting material is positioned over a light source. The flexible film is conformed to a predetermined shape. In some embodiments, the light source is a light emitting diode mounted on a support substrate. The diode is aligned with an indentation in a mold such that the flexible film is disposed between the support substrate and the mold. Transparent molding material is disposed between the support substrate and the mold. The support substrate and the mold are pressed together to cause the molding material to fill the indentation. The flexible film conforms to the shape of the light source or the mold.

DETAILED DESCRIPTION

Figure 1:
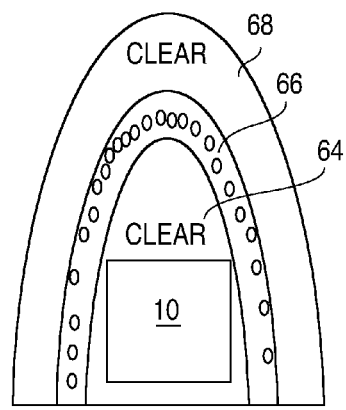
FIG. 1 illustrates a prior art LED mounted on a support structure and covered with a molded lens.

In the device illustrated in FIG. 1, three molds are used, a first mold to form transparent layer 64, a second, larger mold to form phosphor layer 66, and a third still larger mold to form transparent layer 68. The thickness of phosphor layer 66 determines the characteristics such as the color temperature of the light emitted by the device. The thickness of phosphor layer 66 can vary based on variations in the alignment of the phosphor mold, which may undesirably alter the characteristics of the emitted light. For example, phosphor layer 66 may be in the range of 100 μm thick. The mold-alignment tolerance of the phosphor mold may be in the range of 30-50 μm. The high mold-alignment tolerance relative to the target thickness of the phosphor can cause variations in the thickness of the phosphor that undesirably shift the color point of light emitted from the device.

In embodiments of the invention, a wavelength converting material is formed into a flexible film which is molded over a light source such as a semiconductor light emitting device. The film may be fully or partially cured transparent material, such as silicone, which is filled with phosphor. The wavelength converting film may be formed separate from the molding process, which permits tight control of the thickness of the wavelength converting film as well as testing and verification of the characteristics of the film prior to molding. Molding and other processing steps according to the invention may be performed as described in U.S. Pat. No. 7,352,011. In some embodiments, the wavelength converting flexible film is formed on a support film such as an ethylene tetrafluoroethylene film, for example by spreading a mixture of phosphor and silicone over the support film then fully or partially curing the silicone in the wavelength converting film. The wavelength converting material may be temporarily protected by another ethylene tetrafluorethylene film, which is removed before the processing described below. After processing, the support film is generally peeled away from the wavelength converting film. In some embodiments, the support films serves as a release film, which releases a molded lens from the mold.

In some embodiments, a heat dissipating material such as diamond may be added to the wavelength converting film. In some embodiments, a material such as diamond may be added to the wavelength converting film to adjust the refractive index of the film, to improve optical transmission, and/or to improve conversion.

As a preliminary matter, a light source is provided. Though in the examples below the light source is an LED, any suitable light source may be used. Also, though in the examples below the light source is a III-nitride LED that emits blue or UV light, semiconductor light emitting devices besides LEDs and semiconductor light emitting devices made from other materials systems such as other III-V materials, III-phosphide, III-arsenide, II-VI materials, or Si-based materials may be used.

A conventional III-nitride LED 10 is formed by first growing a semiconductor structure on a growth substrate. An n-type region is typically grown first and may include multiple layers of different compositions and dopant concentration including, for example, preparation layers such as buffer layers or nucleation layers, which may be n-type or not intentionally doped, release layers designed to facilitate later release of the substrate or thinning of the semiconductor structure after substrate removal, and n- or even p-type device layers designed for particular optical or electrical properties desirable for the light emitting region to efficiently emit light. A light emitting or active region is grown over the n-type region. Examples of suitable light emitting regions include a single thick or thin light emitting layer, or a multiple quantum well light emitting region including multiple thin or thick quantum well light emitting layers separated by barrier layers. A p-type region is grown over the light emitting region. Like the n-type region, the p-type region may include multiple layers of different composition, thickness, and dopant concentration, including layers that are not intentionally doped, or n-type layers.

Various techniques are used to gain electrical access to the n-layers. Portions of the p-layers and active layer are etched away to expose an n-layer for metallization. In this way the p-contact and n-contact are on the same side of the chip and can be directly electrically attached to contact pads on a suitable mount. The device can be mounted such that light is extracted from the top surface (i.e. the surface on which the electrical contacts are formed) or the bottom surface (i.e. a flip chip with reflective contacts). The growth substrate may be removed from the semiconductor structure or may remain a part of the completed device. After substrate removal, the semiconductor structure may be thinned, and the surface of the n-type region exposed by removing the substrate may be textured to improve light extraction, for example by roughening or forming a photonic crystal structure. In contrast, in a vertical injection LED, an n-contact is formed on one side of the semiconductor structure, and a p-contact is formed on the other side of the semiconductor structure. Electrical contact to one of the p- or n-contacts is typically made with a wire or a metal bridge, and the other contact is directly bonded to a contact pad on the mount. Though the examples below include a flip chip device from which the growth substrate has been removed, any suitable device structure may be used.

One or more wavelength converting materials such as phosphors or dyes may be included in the flexible film molded over the LED. Non-wavelength-converting materials such as $TiO_x$ particles may be included in the flexible film, for example to cause light scattering or to improve the off-state white appearance of the device. The flexible film may be textured to change the optical properties, for example by embossing microlenses to improve light extraction.

An LED combined with one or more wavelength converting materials may be used to create white light or monochromatic light of other colors. All or only a portion of the light emitted by the LED may be converted by the wavelength converting material. Though in the examples below the wavelength converting materials are powder phosphors, any suitable wavelength converting material may be used. Unconverted light may be part of the final spectrum of light, though it need not be. Examples of common combinations include a blue-emitting LED combined with a yellow-emitting phosphor, a blue-emitting LED combined with green- and red-emitting phosphors, a UV-emitting LED combined with blue- and yellow-emitting phosphors, and a UV-emitting LED combined with blue-, green-, and red-emitting phosphors. Wavelength converting materials emitting other colors of light may be added to tailor the spectrum of light emitted from the device. Multiple wavelength converting materials may be mixed and formed in a single film, formed as discrete layers in a single film, or formed as mixed or discrete layers in multiple films.

Wavelength converting materials formed in a flexible film may be combined in a device with other conventional wavelength converting materials, such as pre-formed ceramic phosphor layers that are glued or bonded to the LED, or a powder phosphor disposed in an organic encapsulant that is stenciled, screen printed, sprayed, sedimented, evaporated, sputtered, or otherwise dispensed over the LED.

FIGS. 2-6 illustrate forming a first embodiment of the invention.

Figure 2:
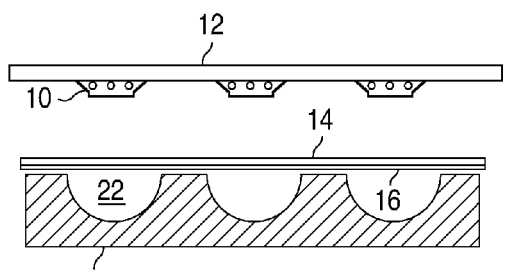
FIG. 2 illustrates a flexible wavelength converting film disposed between a mold and multiple LEDs mounted on a support substrate.

In FIG. 2, several LEDs 10 mounted on a support substrate 12 are aligned with indentations 22 corresponding to each LED 10 in a mold 20. A wavelength converting flexible film 14 is disposed on a support film 16. The wavelength converting film 14 and support film 16 are disposed between support substrate 12 and mold 20. In some embodiments, the wavelength converting film is fully cured. In some embodiments, support film 16 is a material which prevents the molding material 24 described in FIG. 3 from adhering to mold 20, such as ethylene tetrafluoroethylene.

The thickness of wavelength converting film 14 depends on the wavelength converting material used and the desired characteristics of the light emitted from the device. The thickness of wavelength converting film 14 may be between 10 and 200 μm in some embodiments, between 40 and 60 μm in some embodiments, and 50 μm in some embodiments.

Figure 3:
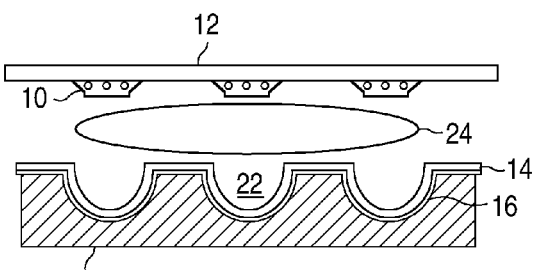
FIG. 3 illustrates molding material disposed between LEDs mounted on a support substrate and a wavelength converting film lining a mold.

In FIG. 3, support film 16 and wavelength converting film 14 are pressed against mold 20 such that they line the indentations 22 in mold 20. For example, support film 16 and wavelength converting film 14 may be stretched over the mold indentations, then a reduced pressure environment or vacuum may be created which pulls the films into the mold indentations as illustrated in FIG. 3. Molding material 24 is disposed between mold 20 and support substrate 12. Though indentations 22 may take any suitable shape, typically indentations 22 are shaped as lenses and molding material 24 is transparent. Though molding material 24 is often silicone, any suitable molding material may be used.

Figure 4:
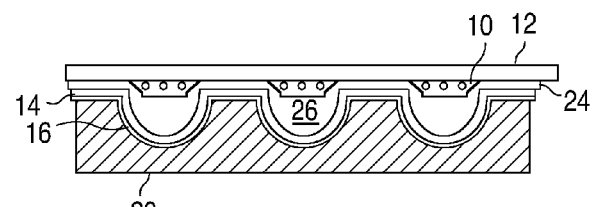
FIG. 4 illustrates the molding material of FIG. 3 molded into lenses over the LEDs.

In FIG. 4 mold 20 and support substrate 12 are pressed together to force molding material 24 to fill indentations 22 in mold 20 and to adhere to LEDs 10 and support substrate 12. A vacuum or reduced pressure environment may be applied to draw molding material 24 into indentations 22. Lenses 26 are formed on each LED 10. Molding material 24 may be cured as appropriate to the molding material, for example by heating, to form solid lenses 26.

Figure 5:
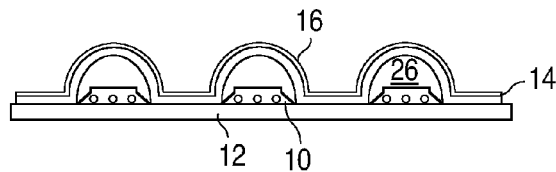
FIG. 5 illustrates the structure of FIG. 4 after removing the mold.

In FIG. 5, mold 20 is removed, leaving lenses 26 formed of molding material 24 over each LED 10. Wavelength converting film 14 and support film 16 are disposed over each lens 26 and between adjacent lenses.

Figure 6:
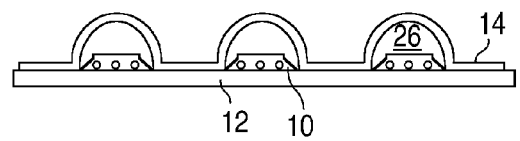
FIG. 6 illustrates the structure of FIG. 5 after removing a support film.

In FIG. 6, support film 16 is removed.

In the device illustrated in FIG. 6, wavelength converting film 14 is spaced apart from LED 10 by lens 26. FIGS. 7-11 illustrate forming a device with the wavelength converting film in direct contact with the LED.

Figure 7:
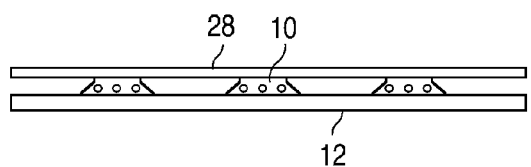
FIG. 7 illustrates a flexible wavelength converting film positioned over LEDs mounted on a support substrate.

In FIG. 7 a flexible wavelength converting film 28 is positioned over LEDs 10, which are attached to support substrate 12. Wavelength converting film 28 may have the same characteristics as the wavelength converting film 14 described above, and may be formed on a support film. In some embodiments, wavelength converting film 28 is only partially cured.

Figure 8:
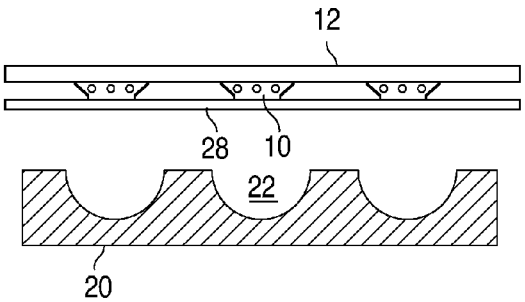
FIG. 8 illustrates the structure of FIG. 7 flipped over and positioned over a mold.

In FIG. 8 LEDs 10 are aligned with indentations 22 corresponding to each LED 10 in a mold 20.

Figure 9:
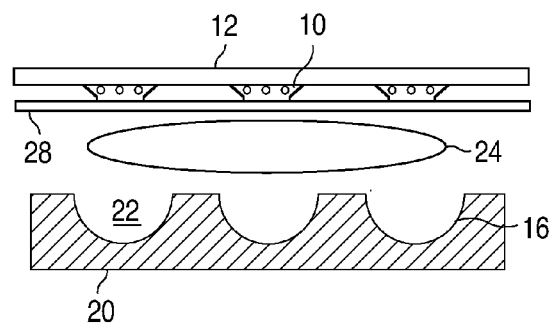
FIG. 9 illustrates molding material disposed between a wavelength converting film and a mold.

In FIG. 9 molding material 24 is disposed between mold 20 and wavelength converting film 28. Mold 20 may be lined with an optional release film, not shown in FIG. 9.

Figure 10:
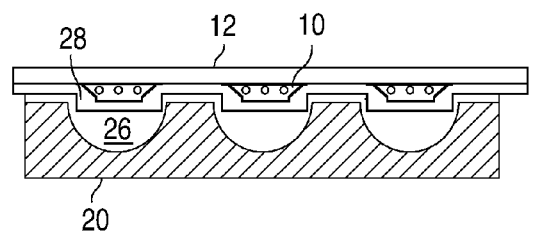
FIG. 10 illustrates the molding material of FIG. 9 molded into lenses over the LEDs.

In FIG. 10, mold 20 and support substrate 12 are pressed together to force molding material 24 to take the shape of indentations 22 in mold 20 to form lenses 26 over each LED 10. Molding material 24 forces wavelength converting film 28 to conform to the shape of LEDs 10 and support substrate 12 and to adhere to LEDs 10 and support substrate 12. Molding material 24 adheres to wavelength converting film 28. Molding material 24 may be cured as described above.

Figure 11:
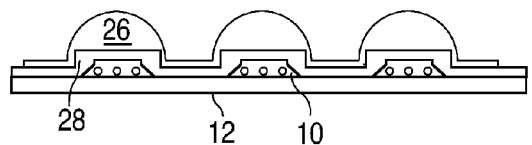
FIG. 11 illustrates the structure of FIG. 10 after removing the mold.

In FIG. 11, mold 20 is removed. A release film remaining over lenses 26 is also removed. In the devices illustrated in FIG. 11, wavelength converting film 28 is in direct contact with LEDs 10 and support substrate 12 between LEDs 10. Lenses 26 are disposed over wavelength converting film 28.

FIGS. 12-16 illustrate forming a device with two wavelength converting films.

Figure 12:
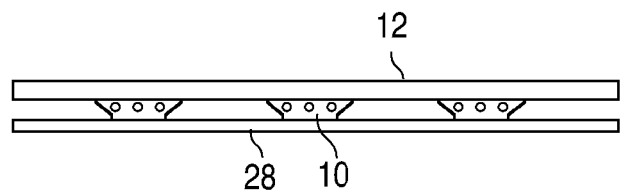
FIG. 12 illustrates a first wavelength converting film positioned under LEDs mounted on a support substrate and a second wavelength converting film positioned over a mold.

In FIG. 12, a flexible wavelength converting film 28 is positioned over LEDs 10 and support substrate 12, as described above in reference to FIG. 7. Wavelength converting film 28 may be formed on a support film and in some embodiments is partially cured. A wavelength converting film 14 and a support film 16 as described above in reference to FIG. 2 are positioned over a mold 20. In some embodiments, wavelength converting film 14 is fully cured. Indentations 22 in mold 20 are aligned with LEDs 10.

Figure 13:
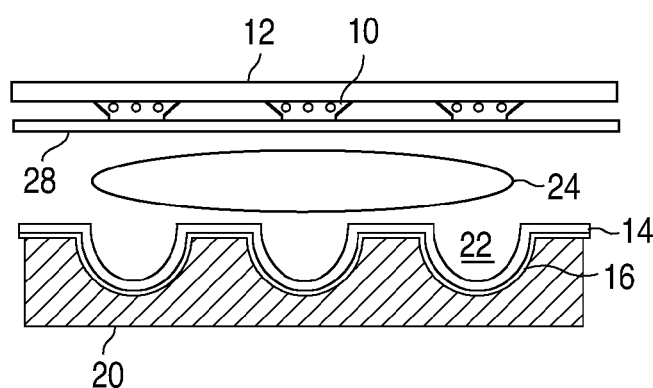
FIG. 13 illustrates molding material disposed between the two wavelength converting films illustrated in FIG. 13.

In FIG. 13 wavelength converting film 14 and support film 16 are pressed into the indentations 22 in mold 20 such that they line mold 20, as described above in reference to FIG. 3. Molding material 24 is dispensed between wavelength converting film 28 and wavelength converting film 14.

Figure 14:
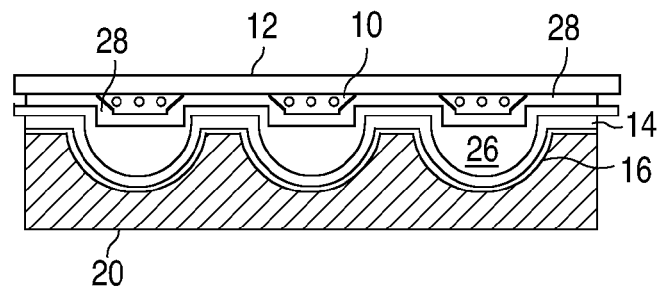
FIG. 14 illustrates the molding material of FIG. 13 formed into lenses over the LEDs.

In FIG. 14 mold 20 and support structure 12 are pressed together. Molding material 24 fills the indentations 22 in mold 20 to form lenses over LEDs 10. Molding material 24 forces wavelength converting film 28 to conform to the shape of LEDs 10 and support substrate 12.

Figure 15:
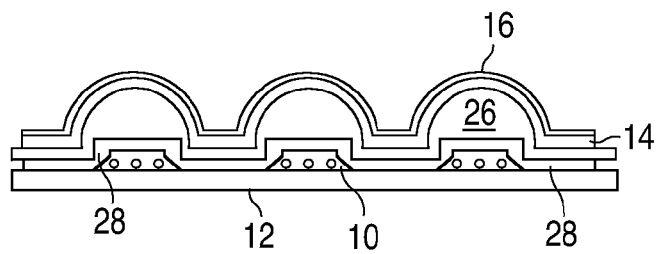
FIG. 15 illustrates the structure of FIG. 14 after removing the mold.

In FIG. 15, mold 20 is removed.

Figure 16:
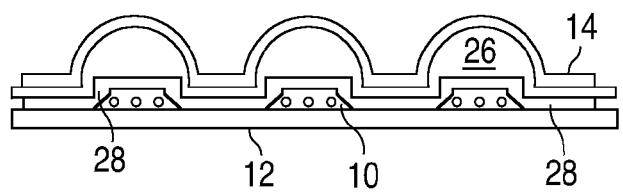
FIG. 16 illustrates the structure of FIG. 15 after removing a support film.

In FIG. 16, support film 16 is removed. In the device illustrated in FIG. 16, a first wavelength converting film 28 directly contacts the top surface of LEDs 10. Lenses 26 are disposed over first wavelength converting film 28. A second wavelength converting film 14 is disposed over lenses 26. The first and second wavelength converting films may include different wavelength converting materials. In one example, LEDs 10 may emit blue light, one of the wavelength converting films may include a yellow- or green-emitting phosphor, and the other of the wavelength converting films may include a red-emitting phosphor.

In some embodiments, an optional, additional transparent layer may be molded over the devices illustrated in FIGS. 6 and 16 to protect wavelength converting film 14. The additional transparent layer may be shaped to increase extraction efficiency and/or sized to provide a desired source size. The material may be selected to improve color vs. angle of the light emitted from the device or to increase overall light output. All or part of the surface of the additional transparent layer may be textured to improve light extraction. In some embodiments, lens 26 has smaller index of refraction than the additional transparent layer, which may reduce the number of unconverted blue photons scattered back toward the LED where they can be lost to absorption. In one example, the index of refraction of lens 26 is 1.4 or lower and the index of refraction of the additional transparent layer is 1.5 or higher.

A molded wavelength converting film as described in the embodiments above may have several advantages over conventional wavelength converting layers. The flexible wavelength converting films may be formed separate from the molding process. Color measurements can be performed in advance to achieve a desired color and films may be tailored to a given LED emission color. Wavelength converting films may be manufactured in large areas at low cost. The distance between LED 10 and wavelength converting film 14, the thickness of the wavelength converting films, and the uniformity of the thickness of the wavelength converting films over the LED may be tightly controlled and optimized to improve extraction efficiency, color control, and source size.

Spacing the wavelength converting film apart from the light source in a near-remote arrangement as illustrated in FIG. 6 as opposed to disposing the wavelength converting film directly on the LED may also have advantages. For example, a near-remote wavelength converting film may be exposed to less heat from the LED, which may allow the use of wavelength converting materials that are temperature sensitive. The photon density in a near-remote wavelength converting layer may be decreased, which may increase light output from the device. The absorption cross section of the LED may be reduced with a near-remote wavelength converting film, which may increase extraction efficiency. In devices with a material such as $TiO_x$ included in the wavelength converting film to improve the off-state white appearance of the device, light loss for a given whiteness may be reduced due to the reduced absorption cross section. Color vs. angle dependence of the emitted light in a near-remote wavelength converted device may be reduced.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method comprising:
   positioning a flexible film over a light source, the flexible film comprising a transparent material filled with wavelength converting material; and
   aligning the light source with an indentation in a mold such that the flexible film is disposed between the light source and the mold;
   disposing transparent molding material between the light source and the mold; and
   pressing the light source and the mold together to cause the molding material to fill the indentation and to cause the flexible film to conform to a predetermined shape.

2. The method of claim 1 wherein the light source comprises a III-nitride light emitting diode mounted on a support substrate.

3. The method of claim 2 wherein the flexible film is in direct contact with the light emitting diode and conforms to a shape of the light emitting diode.

4. The method of claim 2 wherein the flexible film is in direct contact with the mold and conforms to a shape of the indentation.

5. The method of claim 2 wherein the flexible film comprises a powder phosphor disposed in a silicone film.

6. The method of claim 5 wherein the silicone film is fully cured prior to said positioning.

7. The method of claim 5 wherein the silicone film is partially cured prior to said positioning.

8. The method of claim 5 wherein the flexible film further comprises a non-wavelength converting material, wherein the non-wavelength converting material changes an index of refraction of the flexible film.

9. The method of claim 2 wherein the flexible film is disposed on a support film.

10. The method of claim 9 further comprising removing the support film after pressing the light source and the mold together.

11. The method of claim 2 wherein the indentation is shaped as a lens.

12. The method of claim 2 wherein the flexible film is a first flexible film in direct contact with the light emitting diode, the method further comprising:
   positioning a second flexible film comprising a wavelength converting material in direct contact with the mold;
   wherein the transparent molding material is disposed between the first flexible film and the second flexible film.

13. The method of claim 2 wherein pressing the light source and the mold together to cause the molding material to fill the indentation and to cause the flexible film to conform to a predetermined shape comprises creating a reduced pressure environment which draws the molding material into the indentation.

14. The method of claim 1 wherein the flexible film is made by evenly spreading a mixture of phosphor and silicone over a support film then at least partially curing the silicone.

15. The method of claim 1 further comprising heating the mold after pressing the light source and the mold together.

16. The method of claim 15 wherein the mold is heated to a temperature that hardens the molding material.

17. The method of claim 1 wherein:
   the light source is a first light source;
   the method further comprises mounting the first light source and a second light source on a support substrate;
   aligning the light source with an indentation in a mold comprises aligning the mold such that the first light source is aligned with a first indentation and the second light source is aligned with a second indentation; and
   positioning a flexible film over a light source comprises positioning the flexible film such that wavelength converting material is positioned in a space between the first light source and the second light source.

18. The method of claim 17 wherein after pressing the light source and the mold together, a continuous layer of wavelength converting material is disposed over the first light source, the second light source, and the space between the first light source and the second light source.

19. The method of claim 1 wherein a thickness of wavelength converting material in the flexible film is uniform.

* * * * *